United States Patent
Hwang et al.

(10) Patent No.: US 7,456,671 B2
(45) Date of Patent: Nov. 25, 2008

(54) HIERARCHICAL SCALABLE HIGH RESOLUTION DIGITAL PROGRAMMABLE DELAY CIRCUIT

(75) Inventors: Charlie C. Hwang, Hopewell Junction, NY (US); Phillip J. Restle, Katonah, NY (US); Leon J. Sigal, Monsey, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/622,004

(22) Filed: Jan. 11, 2007

(65) Prior Publication Data
US 2008/0169857 A1 Jul. 17, 2008

(51) Int. Cl.
H03H 11/26 (2006.01)
(52) U.S. Cl. .................. 327/276; 327/272; 327/278
(58) Field of Classification Search ......... 327/270–272, 327/276–278, 299
See application file for complete search history.

(56) References Cited

U.S. PATENT DOCUMENTS

| | | | | |
|---|---|---|---|---|
| 5,355,037 A | * | 10/1994 | Andresen et al. | 327/158 |
| 5,777,501 A | * | 7/1998 | AbouSeido | 327/274 |
| 5,900,762 A | * | 5/1999 | Ramakrishnan | 327/277 |
| 6,147,512 A | * | 11/2000 | Sung et al. | 326/82 |
| 6,222,407 B1 | | 4/2001 | Gregor | 327/269 |
| 6,275,091 B1 | | 8/2001 | Saeki | 327/396 |
| 6,304,124 B1 | | 10/2001 | Mizuno | 327/281 |
| 6,307,403 B1 | * | 10/2001 | Kurihara et al. | 326/105 |
| 6,417,713 B1 | * | 7/2002 | DeRyckere et al. | 327/271 |
| 6,518,811 B1 | | 2/2003 | Klecka, III | 327/276 |
| 6,525,585 B1 | * | 2/2003 | Iida et al. | 327/279 |
| 6,756,832 B2 | * | 6/2004 | Reuveni et al. | 327/271 |
| 6,859,082 B2 | * | 2/2005 | Tang | 327/276 |
| 7,391,245 B2 | * | 6/2008 | Heyne et al. | 327/158 |

* cited by examiner

Primary Examiner—An T Luu
(74) Attorney, Agent, or Firm—Lynn L. Augspurger; Robert A. Walsh

(57) ABSTRACT

A hierarchical and modular clock programmable delay circuit structure is described that can achieve almost unlimited fine resolution and unlimited delay range. The same circuit may also be applied to critical circuits that require fine adjustment in timing applications. The modular design allows the circuit and its layout to be synthesized by software to achieve desired delay resolution and range. Constant capacitive load of internal node enhances the linearity of achieved delay by digital controls.

22 Claims, 8 Drawing Sheets

HIERARCHICAL SCALABLE HIGH RESOLUTION DIGITAL PROGRAMMABLE DELAY CIRCUIT

BACKGROUND OF THE INVENTION

1. Field of the Invention

The present invention relates generally to digital circuits for providing delay of digital signals, and more particularly to a high resolution digital programmable delay circuit.

2. Description of Background

Modern digital logic circuits, such as those used in digital data processors, are characterized by short signal propagation times which are enhanced by decreased switching element (e.g. transistor) sizes and increased integration density. The short signal propagation times are exploited by reducing clock cycle times so that logic functions and data processing can be carried out more rapidly.

However, signal propagation time is necessarily finite and non-uniform due to capacitances and resistances of interconnections and other loads such as those presented by the gates of CMOS devices which are currently the logic circuit technology of choice for most digital circuits and the signal propagation time within the circuits, themselves. The non-uniformity of signal propagation time has increased with digital processor complexity and burdensome design analyses are generally required to determine critical signal paths and maintain propagation time within tolerances in those critical paths. Even non-critical paths may present problems and cause errors of logic function in relatively simple circuit configurations and which cannot be reliably predicted.

Consider, for example, a circuit in which two related signals are propagated in parallel such as respective bits of a single byte of binary code representing a character or number.

If a logical combination of those two signals or bits is to be done, it is clearly imperative that either signals or bits be present and determinable as being of the appropriate logic state when the logic function is allowed to occur in order to avoid errors. Of course, it would be possible to latch signals at each point of the propagation path or to delay the logical operation until all signals are unconditionally settled to a stable logic state.

However, either such possibility would greatly reduce the operational speed of the overall logic circuit or processor. Thorough design analysis and adjustment of propagation time of each node of each signal propagation path would be economically prohibitive and does not guarantee the performance of the circuit. Accordingly, it is common practice to provide programmable delay elements in such signal paths to delay selected ones of related signals to correspond to the last to arrive in order to automatically synchronize their arrival at a particular node.

In general, it is also common practice to generate delays in digital signals by propagating signals through a plurality of rapidly switched identical stages such as serial pairs of inverter circuits and which are arrayed such that propagation time over connections between stages is substantially constant. While some variation in propagation time is inevitable, the propagation time through a pair of inverters is a sufficiently small time increment to approximate the required delay with a resolution which is short compared to clock cycle time. However, since propagation time may vary between stages and collectively over a plurality of stage (e.g. due to temperature, supply voltage and other operational and environment conditions, it is generally necessary to provide for empirical determination of the number of stages which will provide a required delay period at any given time in order to suitably program a delay element.

The ability to program such delay elements potentially reduces the design burden of designing particular delay elements for each node of a circuit path. However, it should be appreciated that delay elements can consume significant amounts of chip space, depending on the maximum amount of delay to be accommodated. While the maximum delay can be estimated, the maximum delay must be matched fairly closely with the actual delay in order to avoid excessive consumption of chip space and specific designs of delay elements for specific maximum delays may be required, depending on other operational constraints such as so-called set-up time.

That is, if delays are reasonably stable, it may be acceptable from a circuit design point of view to more-or-less permanently program the delay element with a few bits of read only memory or to use some type of propagation time monitoring and data collection circuit (external to the delay element) which adjustably reprograms the delay element bases on some statistical criteria in regard to error rate, propagation time variation, external conditions such as supply voltage or temperature of the like. This type of expedient allows the delay element to be physically formed on a chip in a step-and-repeat fashion since the delay stages may be made identically and the programming arrangement merely gates the output of each stage appropriately to derive the output from the stage which will provide the needed delay, such as by providing a simple multiplexer at each stage of the delay element.

On the other hand, there are many applications in which operation time is sufficiently critical that reprogramming is desirable upon the detection of any error and must be completed based on a single measurement or detection of actual propagation time, such as by sending a single signal transition through the delay element. Circuit designs capable of such short set-up time are substantially more complex since they must internally measure signal propagation time through the delay element and immediately adjust the location at which at which the output is to be taken. It is also necessary to provide equal delay from each tap of the delay line to the output of the multiplexer including the connections from the delay elements to the multiplexer inputs and accommodation of this requirement increases the complexity of the delay element design and requires unique layouts for delay elements of each different maximum delay to be produced.

To do this, it has been considered necessary to store propagation time information in the delay element and to use a single multiplexer having a number of inputs equal to the number of delay stages which is responsive to the stored propagation time data. This latter requirement prevents the delay element to be physically produced by the simple step-and-repeat fashion alluded to above since a different multiplexer design must be provided for each maximum delay. Again, there is a trade-off between chip space and the number of multiplexer designs which may be required in the overall logic circuit or processor design.

In summary, fast set-up time and ease of extendibility of the delay element architecture have been mutually exclusive. This mutual exclusivity can be readily understood from the fact that provision of a simple multiplexer at each stage of the delay element requires serial propagation of signals through a number of the multiplexers. Thus the propagation time through the serial chain of multiplexers after the signal has been tapped from one of the serially connected delay stages precludes the propagation time through the serially connected multiplexers from being directly measured consistent with propagation time data being stored in a latch in a replicable delay element stage. Therefore, a search for the correct stage at which to tap a signal from the delay line requires a number of repetitions to achieve the correct total delay through both a serial array of delay elements and a serial array of multiplexers. Viewed in a slightly different way, the circuit designer would prefer to avoid such problems and obtain a delay element circuit design and layout that would achieve the required delay.

SUMMARY OF THE INVENTION

It is an object of the present invention to provide a hierarchical scalable circuit that can achieve unlimited fine resolution and unlimited delay range. This same circuit may also be applied to critical signals that require fine adjustment in timing.

It is another object to have the capacitive loads of all internal nodes stay constant independent of the number of stages. Additional stages may be added to increase the delay range without affecting the timing of earlier stages where no device resizing is required.

The circuit includes passgate groups which can provide finer delay resolution by further dividing the devices of the passgate groups while keeping the total devices sizes in the entire module constant. All equivalent nodes in all stages have identical capacitive loads and driver devices sizes. This will ensure the waveforms matches at all stages and enhance linearity of the programmable delay, and the circuits with small and large delay ranges may all be synthesized from the base module with the same structure from logic, circuit, and layout point of view.

For high performance large chips with multiple clock meshes or domains, the timing of the clock signals may need to fine-tune under many situations. For example, clock timing may need to be adjusted on a per chip basis due to non-uniform device speed or processing variations across the same chip to minimize clock skews. Chip design may have clock skews at different configurations when the voltages or clock speeds and need dynamic adjustments. Being able to make fine adjustment as a small percentage of the clock cycle time is critical in improving chip performance.

Additional objects, features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
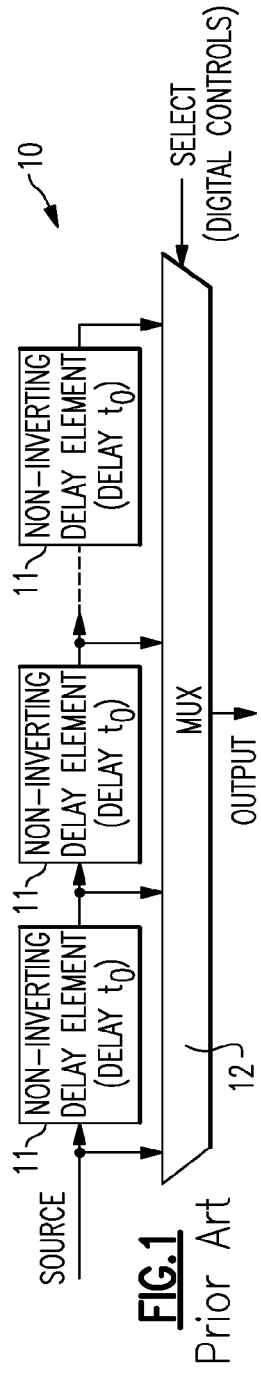
FIG. 1 illustrates the prior art.

Referring now to the drawings in greater detail, in particularly to FIG. 1 there is schematically shown a representation of a conventional programmable delay circuit 10 with exemplary of known elements. In such designs of this type, a plurality of delay elements 11 serially connected to a signal source not shown. Each of the delay elements 11 and the signal source are connected to a multiplexer 12. In operation, a signal is launched serially into the delay elements 11 from the source. When the programmed delay time is achieved, a select signal is generated which controls the multiplexer 12 and generates an output signal with the appropriate time delay.

It has been found that the minimum delay adjustment of a digital programmable delay is limited by the speed of devices and the minimum achievable delay of the delay element. Further a large multiplexer is required when a wide range of delay setting is needed as the type shown in FIG. 1

Figure 2:
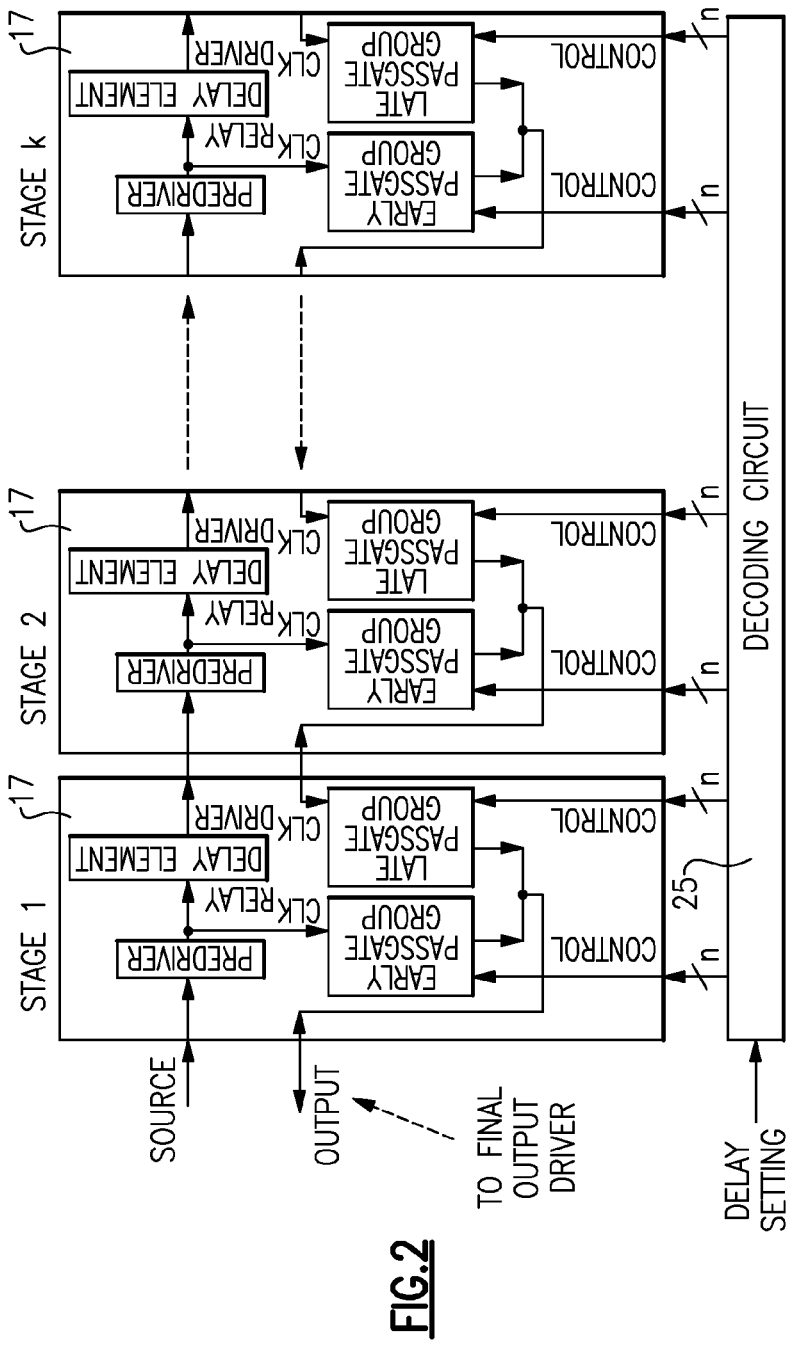
FIG. 2 illustrates the hierarchical multi-stage programmable delay circuit in accordance to the present invention.

The present invention is shown in FIG. 2 which is a hierarchical design 15 having a plurality of stages 17. Each stage 17 includes a pre-driver, a delay element, an early passgate group, and a late passgate group. The stages are serially connected and are all connected in parallel to a decoding circuit 25 which is programmed by a predetermined delay setting. In operation a source signal is inputted to the pre-driver which generates a clock (CLK) early signal to the early passgate group and a signal to the delay element. In turn the delay element provides a signal to the next adjoining stage's pre-driver and the sequence is repeated through all the stages. In each stage, the late passgate group receives a clock (CLK) delayed signal from the passgate group of the subsequent stage. Both the early and late passgates in each stage receives an input control signal from the decoding circuit and outputs a signal to either to the previous late passgate group or at the first stage generates an output to the final output driver. The present invention can be adapted for high performance large chips with multiple clock meshes or domains, where the timing of the clock signals may need to fine-tuned under many situations. For example, clock timing may need to be adjusted on a per chip basis due to non-uniform device speed or processing variations across the same chip to minimize clock skews. Chip design may have clock skews at different configurations when the voltages or clock speeds and the need for dynamic adjustments. Being able to make fine adjustment as a small percentage of the clock cycle time is critical in improving chip performance. Accordingly the present invention uses a clock interpolation circuit to achieve high delay resolution. Therefore the first step is to consider the total devices sizes of the passgate which is sized to be adequate to drive the load attached to the output that redrives the clock signals out.

Figure 3:
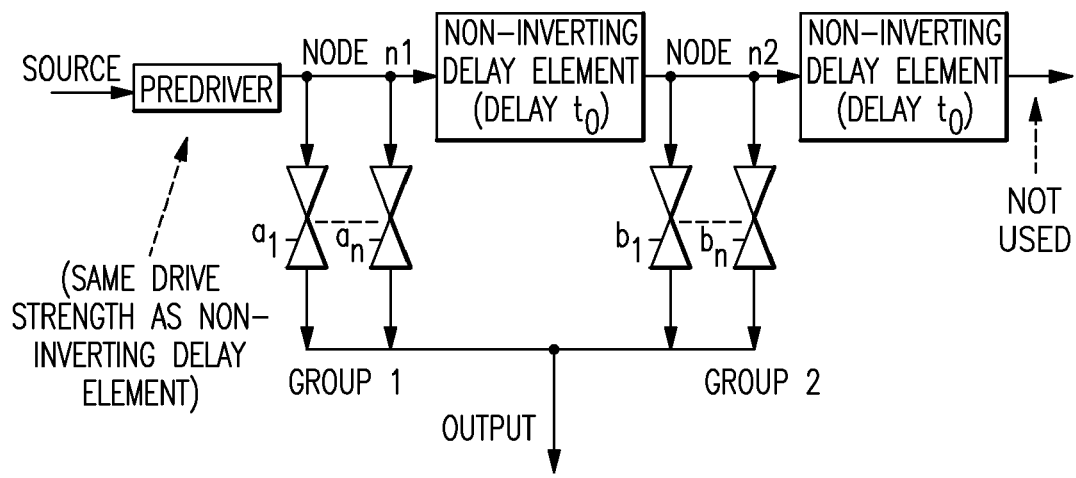
FIG. 3 illustrates an embodiment of a clock interpolation circuit.

In the next step, the passgates as shown in FIG. 3 are subdivided into "n" passgates equally. If n passgates are used for each group, each passgate will have 1/n relative to the original devices sizes determined in the first step. By doing so, the total loading on Node n1 and Node n2 will be independent of the number of division, n, chosen. So identical clock/signal slew/delay may be maintained.

Figure 4:
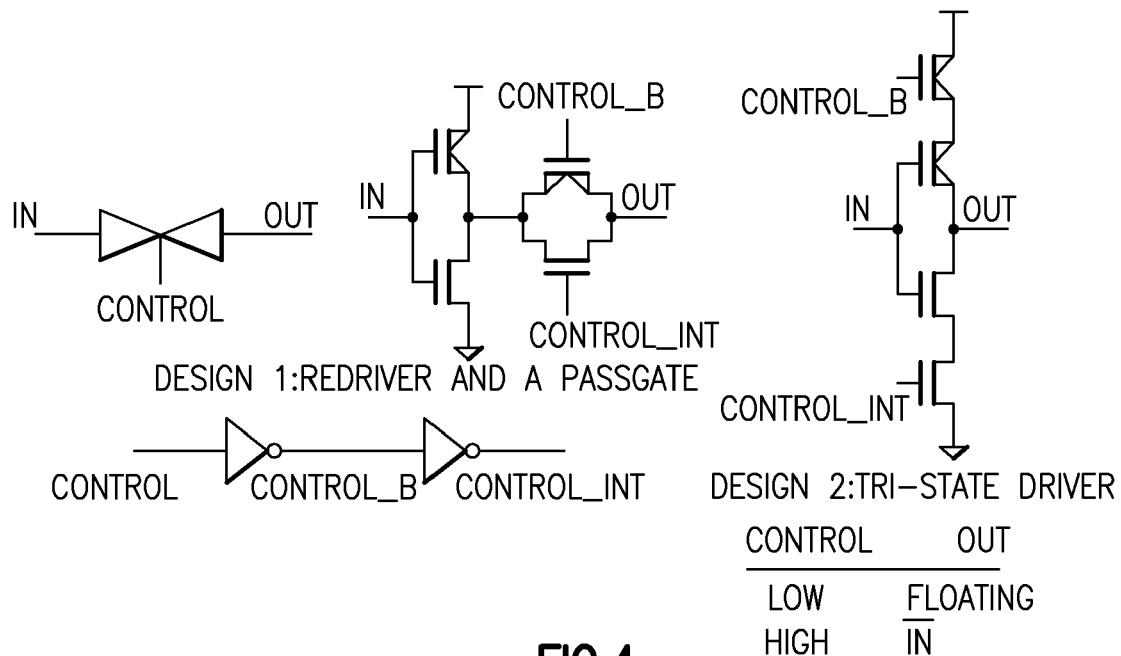
FIG. 4 illustrates an embodiment of tri-state passgate designs.

Only tri-state passgates with individual controls like the two examples shown in FIG. 4 can be used to pass either the earlier or delayed clock. The outputs of the passgates are shorted together. The passgates should have the same input capacitive loading whether the passgates are turned on or off. This is important so that the drivers driving Node n1 and n2 will see a constant load and the clock slew and delay at Node n1 and n2 can be maintained at different mux settings.

FIG. 4 shows the tri-state passgate circuits. A control signal for a particular passgate is re-buffered twice with inverters. The re-buffered control signal, control_b and control_int, are used to control the passgate so that any noise at the incoming control signal may be filtered out. It's critical to keep the noise at control_b and control_int down so they don't propagate to output nodes. It's also critical to use tri-state passgate so inactive passgates do not fight with active ones.

Note in FIG. 3 each passgate should get an independent control, a1-an, b1-bn. But at any given time, there should be exactly n out of the 2n controls are turned high if each passgate has the same drive strength. The other n controls should be low. This way we can keep constant drive strength from the passgates to drive the output node and so maintain identical slew. If drive strength of the passgates are not identical, only the settings of the controls that results in the same drive strength should be used.

Node n2 is delayed version of Node n1. Since some tri-state passgates redriving n1 and n2, respectively, may be turned on at the same time, the waveform of the output node will be the average of the driving effect of all the turned-on passgates. $t_{d0}$ is the minimum delay achieved by turning on only passgates in group 1, By changing the ratio of number passgates turned on in group 1 and group 2, clocks/signals with delay between $t_{d0}$ and $t_{d0}+t_d$ The following is a table of possible settings and delays.

| number of 1's in group 1 ($a_1$ to $a_n$) | number of 1's in group 2 ($b_1$ to $b_n$) | delay |
| --- | --- | --- |
| n | 0 | $t_{d0}$ |
| n − 1 | 1 | $t_{d0} + 1/n * t_d$ |
| n − m | m | $t_{d0} + m/n * t_d$ |
| 0 | n | $t_{d0 + td}$ |

Where the minimum delay resolution is approximately $1/n*t_d$, n may be increased to further reduce per-step delay at the expense of more control signals but not total passgate device sizes.

The delay of the non-inverting element, $t_d$, maybe chosen to fit the needs of the applications. The delay, $t_d$, general should not be too large so that the redrivers in the passgates from different groups will be fighting each other for too long and create large DC current. When longer delay is needed, multi-stage programmable delay circuit described hereinafter should be used.

To create truly linear delay vs. the control settings, the waveform at node n1 and n2 should be as similar as possible. The predriver in FIG. 3 should be sized to have the drive strength as the delay element. A dummy load-matching delay element should be added to n2 to maintain the capacitive loading on n2 the same as that of n1.

One major advantage of this invention is that no matter what delay setting is chosen, the output clock slew will stay constant. Keeping slew constant is critical to linearity of the programmable delay. It's convenient to use the same device sizes for all individual passgates like the examples shown above. By doing so, it's easier to make sure the sum of active passgate device sizes stay constant at all settings and thus achieve good linearity. But it is also possible to use passgates of different sizes. For example combining two or more passgates into one to save number of control signals. One example is to use passgates of sizes 1x, 2x, 4x, 8x. Any driver strength from 0x to 15x may be achieved with these 4 passgates. The decoding circuits that generate these control signals need to be carefully designed so the total drive strength from associated passgate groups stay constant.

Figure 5:
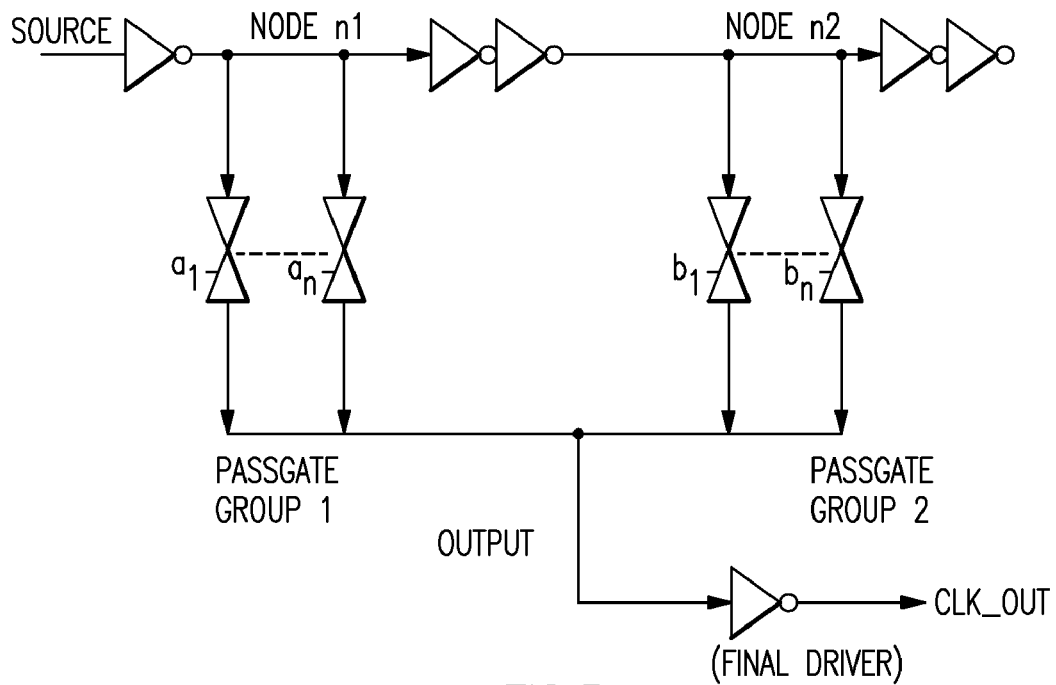
FIG. 5 illustrates an embodiment of a one-stage programmable delay circuit.

In the actual implementation, the linearity of delay vs. control settings may be further enhanced by tuning the device size of each passgate differently as shown in FIG. 5. To keep the output signal slew consistent when changing the delay settings, it is important to tune the passgate and final driver sizes so the signal rise/fall times at the output are larger than the per stage delay, $t_d$.

Figure 6:
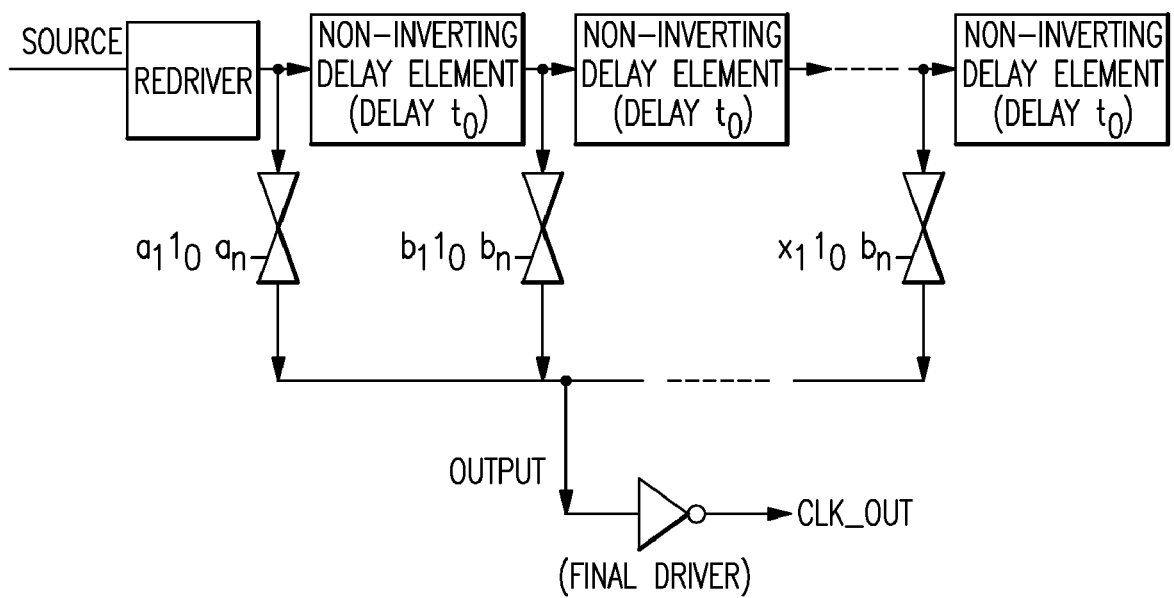
FIG. 6 illustrates an embodiment of a multi stage programmable delay circuit.

To extend the programmable delay range, multi-stage structure may be employed as shown in FIG. 6. The concerns about this structure are that the total capacitive loading on the output node increases with the number of stages. The device sizes of the passgates need to be increased and returned. If high number of stage is required for long maximum delay the whole circuit size may not be reasonable. This structure is not scalable for long maximum delay.

A scalable hierarchical structure shown in FIG. 2 may be used to circumvent the above problem. In this structure, the circuits are divided into stages. Each stage has only two passgate groups. To ensure that the clocks/signals feeding the early and late passgate groups of the same stage have the same phase, the predriver and the delay element should be both inverting or non-inverting. Like the circuit in FIG. 3, the device size of the pre-driver should be tuned to match the device sizes of the passgate groups so that $clk_{early}$ and $clk_{late}$ have similar waveforms. Additional delay may be added to the predriver if needed.

The controls of passgate groups from the decoding circuits are implemented as following:
1. Only one stage can be active at a time. The active stage will have controls like the one in FIG. 3 to achieve clock averaging between the early and late clocks of the active; stage;
2. All stages before the active stage will have their early passgate group turned off and its late passgate group completely on;
3. The stage immediate after the active stage becomes a dummy stage will have their early passgate group complete on and late passgate group completely off; and
4. All stages after the dummy stage becomes inactive stages. Their settings are not important because the return clocks generated by these stages will be gated off by the dummy stage.

Figure 7:
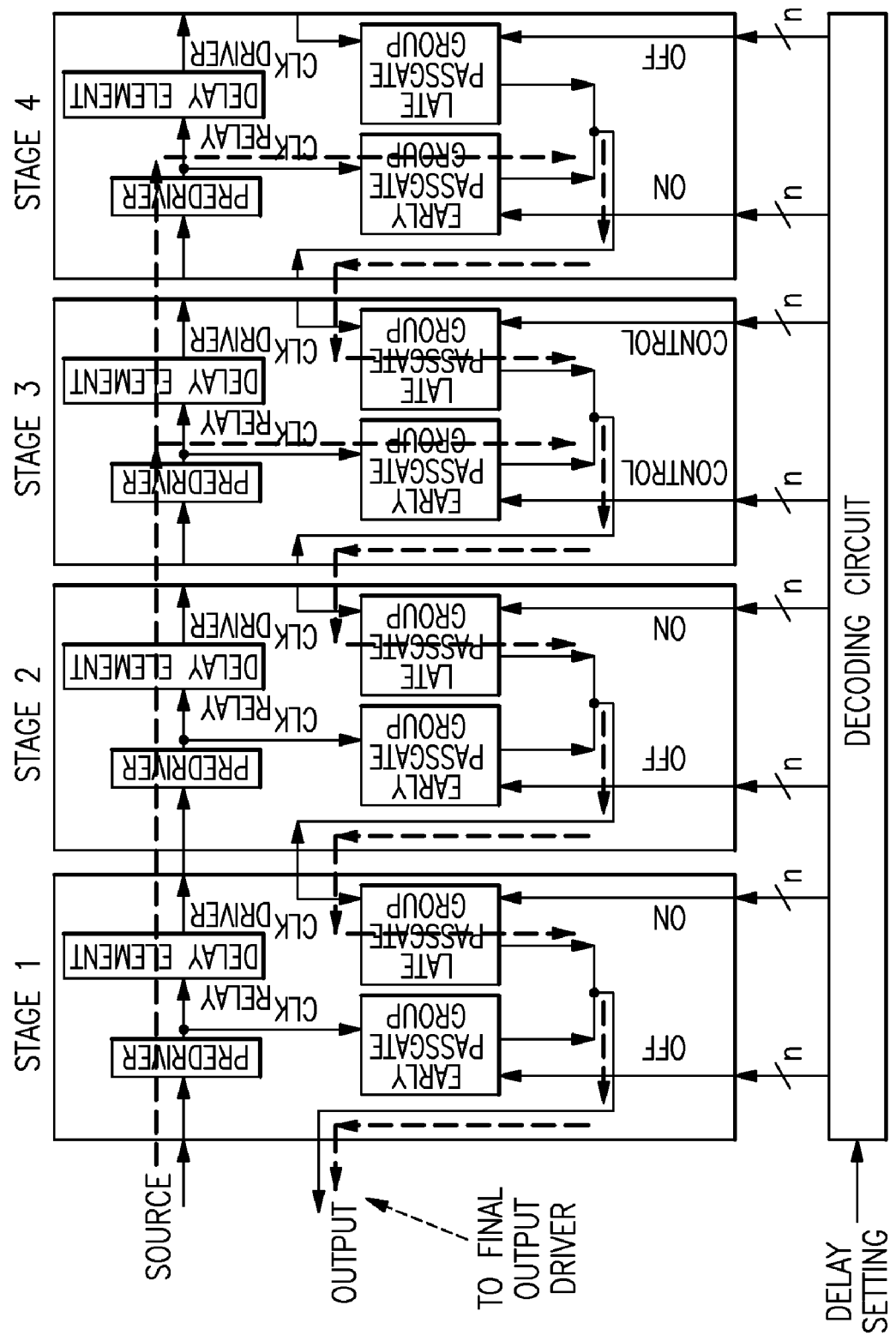
FIG. 7 illustrates an embodiment of active clock paths in the programmable delay circuit shown in FIG. 2 when stage 3 is active.

Due to requirement of number 3 above, there has to be a dummy stage as the last stage to provide the path for delayed clock. FIG. 7 illustrates the active clock paths when stage 3 is active in a 4 stage system. The delays of various elements in FIG. 7 are denoted as:

Td: delay element; Tpr: predriver; and Tp: passgate group.

The minimum and maximum delays when a particular stage is active are (where n is the number of independently controlled passgates in each passgate group)

| active stage | minimum delay | maximum delay | resolution |
|---|---|---|---|
| 1 | Tpr + Tp | 2 * Tpr + Td + 2 * Tp | (Tpr + Td + Tp)/n |
| 2 | 2 * Tpr + Td + 2 * Tp | 3 * Tpr + 2 * Td + 3 * Tp | (Tpr + Td + Tp)/n |
| 3 | 3 * Tpr + 2 * Td + 3 * Tp | 4 * Tpr + 3 * Td + 4 * Tp | (Tpr + Td + Tp)/n |
| j | j * Tpr + (j − 1) * Td + j * Tp | (j + 1) * Tpr + j * Td + (j + 1) * Tp | (Tpr + Td + Tp)/n |

The resolution stay constant when different stage becomes active.

Figure 8:
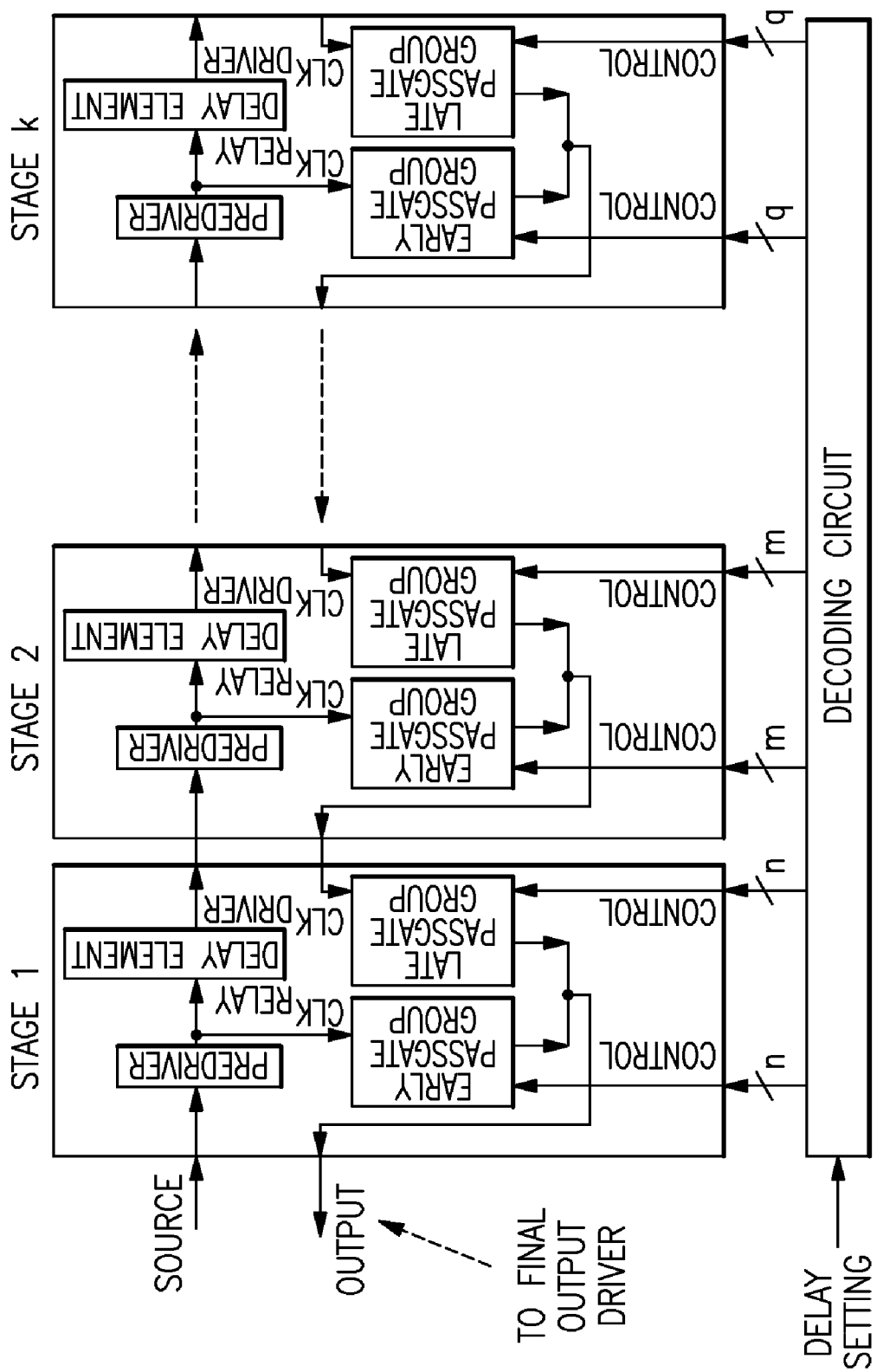
FIG. 8 illustrates an embodiment of variable numbers of controls on each stage.
Figure 9:
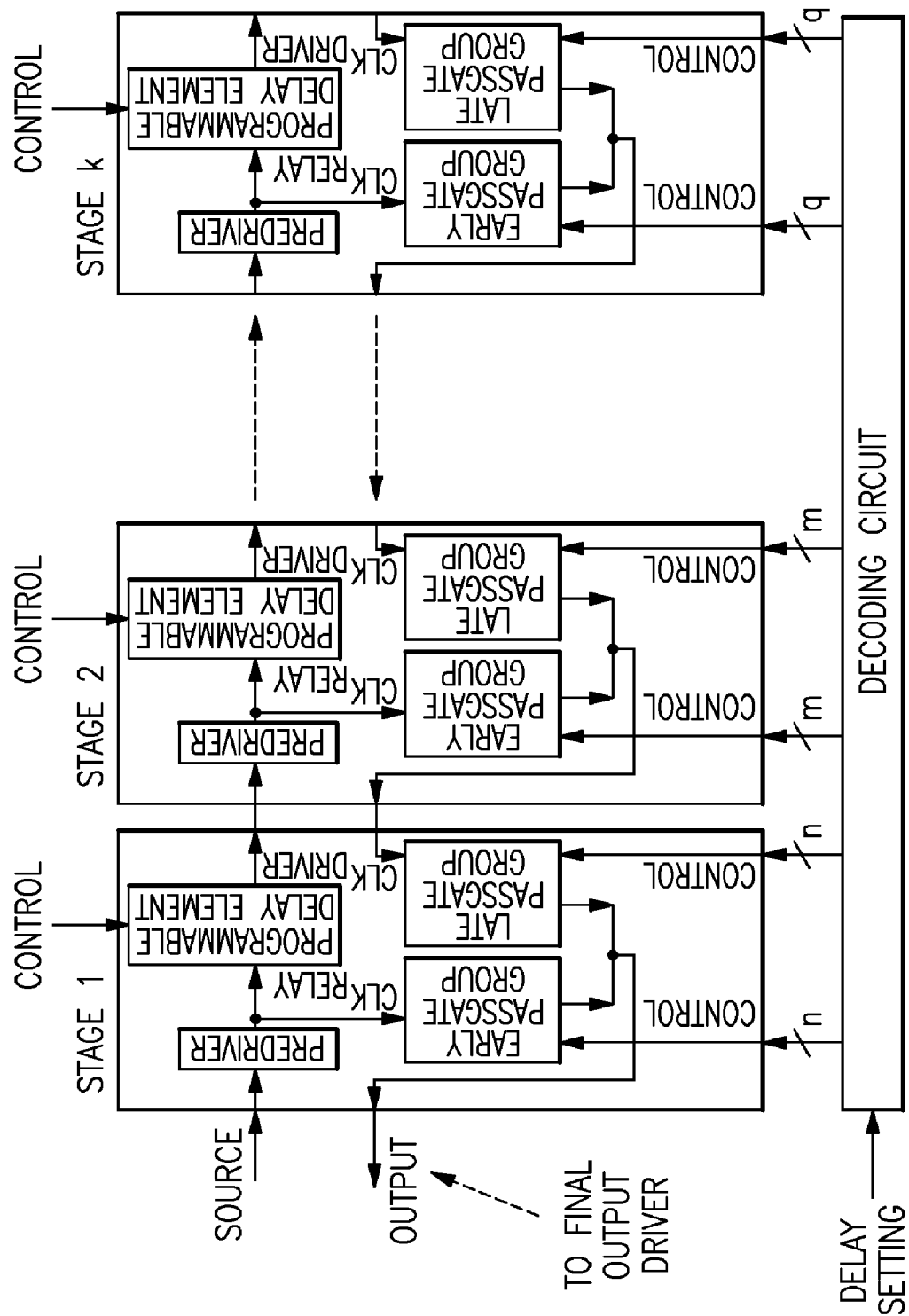
FIG. 9 illustrates an embodiment of use programmable delay element as delay elements.

One variation of this structure is that different number of control may be used on different stages to achieve variable resolution on each stage, as shown in FIG. 8. This way, more control may be given to the delay range used most often for a particular application. For more flexibility, programmable delay elements can be used to create delays between adjacent stages as shown in FIG. 9. This way one can focus on a certain range of delays more precisely and potentially save circuit areas.

Figure 10:
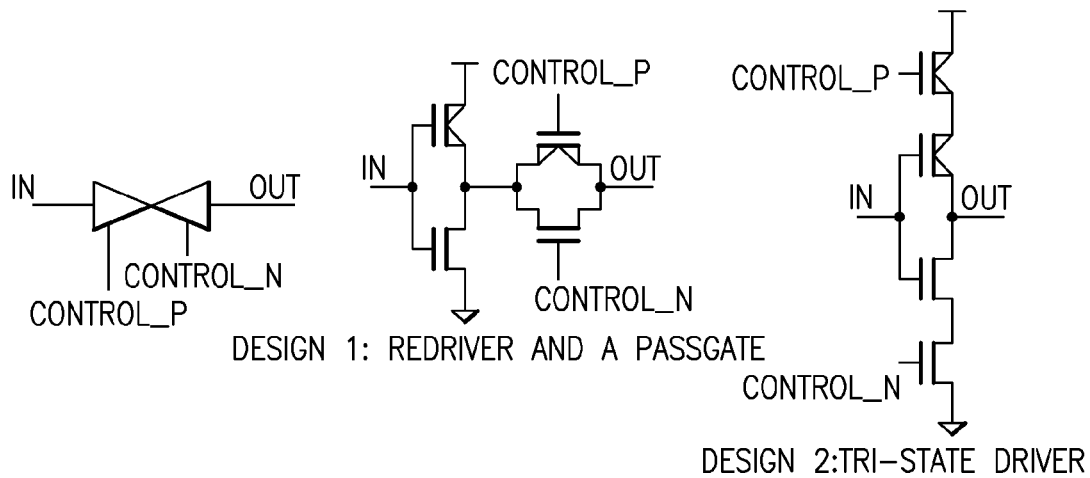
FIG. 10 illustrates embodiments of tri-state passgate designs with separate control for p and n devices for duty cycle adjustment.

Another possibility in this design is to provide separate controls for the p and n devices in the tri-stage passgates to vary the rising and falling slew of the output clock waveform independently for clock duty cycle adjustment as illustrated in FIG. 10.

Figure 12:
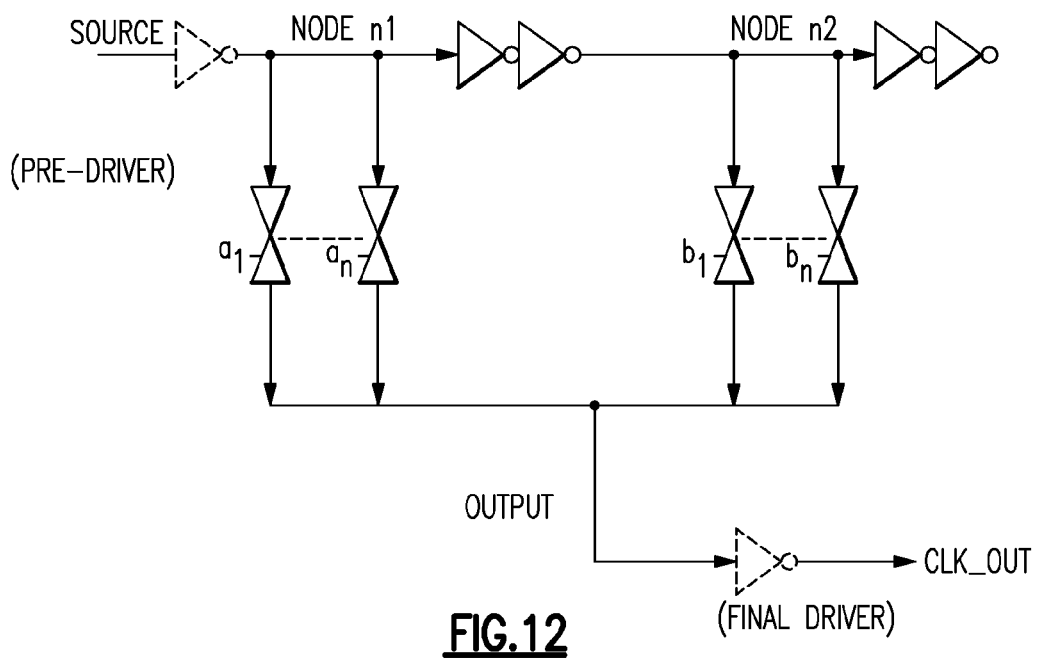
FIG. 12 illustrates an embodiment of saving the predriver or the final driver to minimize delay.
Figure 11:
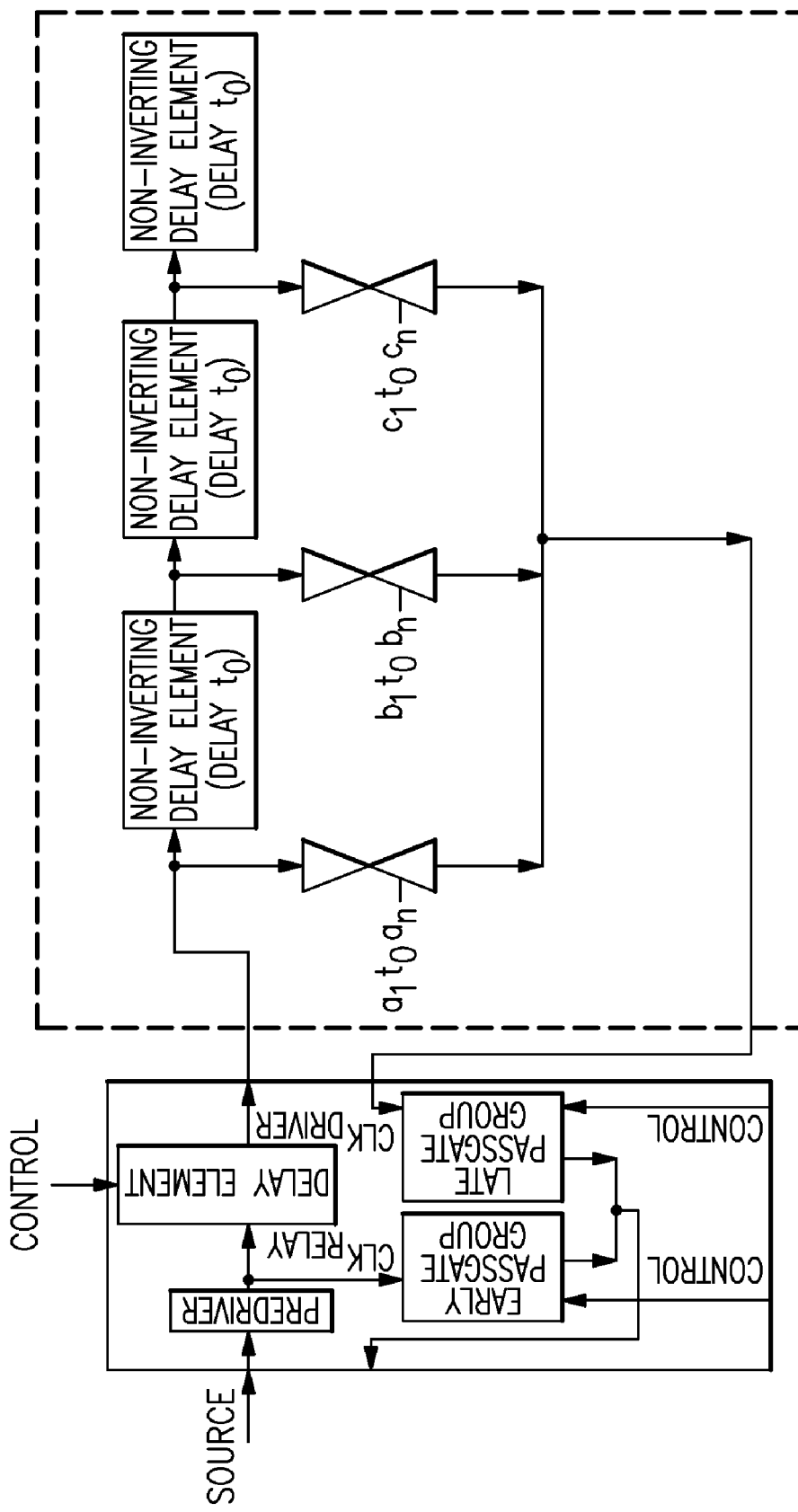
FIG. 11 illustrates an embodiment of combination of the structures in FIGS. 2 and 6.

Since the structure in FIG. 6 is usable for small number of stages, one can use the structure in FIG. 6 as the last stage to save some device areas as shown in FIG. 11. In some applications, it may be desired to minimize the minimum delay through the programmable delay circuits. In those cases, we can eliminate either the pre-driver or the final driver or both at the cost of less linearity and slightly inconsistent output rise and fall times as shown in FIG. 12. To save power, the clock may turn off after the dummy stage and not sent to inactive stages.

It should be noted that all equivalent nodes in all stages have identical capacitive loads and driver device sizes. This will ensure the waveforms matches at all stages and enhance linearity of the programmable delay; and circuits with small and large delay ranges may all be synthesized from the base module with the same structure from logic, circuit, and layout point of view.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A hierarchical multi-stage programmable delay circuit comprising:
   a plurality of delay stages, each stage connected in series having a preset maximum propagation delay times;
   a decoder circuit, which permits only one stage to be active and controls the amount of delay in the active stage; and
   each stage has a predriver, delay element, an early passgate group having an output, and a late passgate group having an output.

2. The circuit of claim 1 wherein each passgate group has a plurality of devices in order to achieve a finer resolution by increasing the number of devices and keeping the device size constant.

3. The circuit of claim 1 the pre-driver generates an early clock and sends a delay signal to an adjoining stage.

4. The circuit of claim 3 wherein a late clock is generated by a later stage determined by the decoder circuit.

5. The circuit of claim 4 wherein the generated early clock and late clock are in-phase to each other.

6. The circuit of claim 5 wherein early and late clock signals are supplied to the early and late passgate groups respectively.

7. The circuit of claim 1 wherein the output node of all passgates has a constant capacitive load.

8. The circuit of claim 1 wherein the early and late passgate groups contains the same number of passgates with equal device sizes.

9. The circuit of claim 8 wherein the outputs of all passgates are shorted together.

10. The circuit of claim 8 wherein only a fixed number of passgates are active at any delay setting for constant drive strength.

11. The circuit of claim 8 wherein the passgates are tri-state passgates that have three output states: high, low, and floating.

12. The circuit of claim 11 wherein each tri-state passgate has one driver and a passgate.

13. The circuit of claim 12 wherein each tri-state passgate contains two pfet's and two nfet's stack between ground and vdd.

14. The circuit of claim 13 wherein the pfet and nfet of the driver have separate control for duty cycle adjustment.

15. The circuit of claim 1 wherein multiple delay elements and passgate groups are used to increase delay range.

16. The circuit of claim 1 wherein identical circuit for one stage is replicated and cascaded to increase delay range without practical limit.

17. The circuit of claim 1 wherein the stage after the active stage is used as a dummy stage to generate a late clock for the active stage.

18. The circuit of claim 1 wherein all inactive stages prior to the active stage provide pass-through for a delayed clock by activating their late passgate group.

19. The circuit of claim 18 wherein a clock going to the inactive stages after a dummy stage may be turned off to save power.

20. The circuit of claim 1 wherein the delay element in one or all of the stages may be made programmable to create flexible delay range.

21. The circuit of claim 1 wherein the number of passgate devices in each stage may be different to provide different delay resolution at different delay range.

22. The circuit of claim 1 wherein either the predriver or a final driver may be omitted to reduce minimum delay.

* * * * *